United States Patent
Vincent

(10) Patent No.: US 11,509,268 B2
(45) Date of Patent: Nov. 22, 2022

(54) POWER CONTROL AND INDICATOR FOR PREAMP OF ACOUSTIC STRING INSTRUMENT

(71) Applicant: Gary Vincent, Clarksdale, MS (US)

(72) Inventor: Gary Vincent, Clarksdale, MS (US)

( * ) Notice: Subject to any disclaimer, the term of this patent is extended or adjusted under 35 U.S.C. 154(b) by 5 days.

(21) Appl. No.: 17/105,037

(22) Filed: Nov. 25, 2020

(65) Prior Publication Data

US 2022/0166392 A1    May 26, 2022

(51) Int. Cl.
| | |
|---|---|
| *H03F 3/183* | (2006.01) |
| *F21V 23/04* | (2006.01) |
| *H04R 3/00* | (2006.01) |
| *H01M 50/543* | (2021.01) |
| *F21Y 115/10* | (2016.01) |
| *F21W 111/00* | (2006.01) |

(52) U.S. Cl.
CPC ............. *H03F 3/183* (2013.01); *F21V 23/04* (2013.01); *H01M 50/543* (2021.01); *H04R 3/00* (2013.01); *F21W 2111/00* (2013.01); *F21Y 2115/10* (2016.08); *H01M 2220/30* (2013.01); *H03F 2200/03* (2013.01)

(58) Field of Classification Search
CPC . H03F 3/183; H01M 50/543; H01M 2220/30; F21V 23/04; H04R 3/00; F21Y 2115/10; F21W 2111/00

USPC ................................ 381/118; 84/1, 723, 726
See application file for complete search history.

(56) References Cited

U.S. PATENT DOCUMENTS 7,015,390 B1    3/2006    Rogers

*Primary Examiner* — Vivian C Chin
*Assistant Examiner* — Friedrich Fahnert
(74) *Attorney, Agent, or Firm* — IpHorgan Ltd.

(57) ABSTRACT

A power control and indicator device for coupling to an acoustic string instrument preamp is provided. The device includes a light emitting diode having an anode terminal and a cathode terminal, a switch having a first terminal and a second terminal, the switch having a closed position that closes a circuit between the first and second terminal and an open position that opens the circuit between the first and second terminal, a battery connector having a positive terminal and a negative terminal, the battery connector adapted to couple to a battery, a preamp connector having a positive terminal and a negative terminal, whereby with a battery connected to the battery connector, wherein with the switch in the closed position, the light emitting diode is powered and illuminates and the battery connector is coupled to the preamp connector, the battery provides power to the preamp connector, and wherein with the switch in the open position, the light emitting diode is not powered and does not illuminate and the battery connector is not coupled to the preamp connector and the battery does not provide power to the preamp connector.

11 Claims, 4 Drawing Sheets

POWER CONTROL AND INDICATOR FOR PREAMP OF ACOUSTIC STRING INSTRUMENT

FIELD OF THE INVENTION

The present invention relates to pre-amps for string instruments and in particular for acoustic guitars.

BACKGROUND OF THE INVENTION

The invention is applicable to various string instruments. However, the disclosure will be directed primarily to acoustic guitars. It will be understood that the teachings of the invention are applicable to other string instruments.

Electric guitars are often amplified by means of a magnetic pickup built-in to the electric guitar. Typically one or more so-called magnetic pickups are used in electric guitars. The pick-up of the electric guitar may be connected to potentiometers for volume and tone and a two-conductor output jack. A guitar cable typically has a two-conductor male connector at each end of the cable. One connector plugs in to the guitar output connector and the other connector of the cable plugs in to an amplifier. The electric signal developed by the magnetic pick is coupled to the amplifier via the guitar cable. Traditionally, there is no electrical amplification of the signal from the magnetic pickup within the electric guitar.

In contrast, traditionally, the acoustic guitar did not include electrical amplification. However, amplification of the acoustic guitars is desirable for various reasons. For example, for performances it is often necessary to amply the sound level of an acoustic guitar. One manner of amplification utilizes a pickup on the acoustic guitar.

Due to the inherent difference in constructions between an electrical guitar and an acoustic guitar, a magnetic pickup is often not desirable in an acoustic guitar. Rather, a piezoelectric pickup is usually preferred. The piezoelectric pickup more accurately produces an electrical signal reflecting the tonality of the acoustic guitar.

However, the piezoelectric pickup produces a weaker signal in comparison to the magnetic pickup. To address this issue, a preamp is often located in the acoustic guitar between the piezoelectric pickup and the guitar output connector. Thus, the guitar cable coupled to the output connector of the acoustic guitar will receive a stronger signal than the signal output from the piezoelectric pickup. The preamp is powered by a battery, such as a typical 9 volt battery, also located in the acoustic guitar. This arrangement has been very successful in general.

Typically when the guitar cable is plugged in to the acoustic guitar and an amplifier, the preamp circuit is complete and the battery is under load. When the battery discharges to a level unable to power the preamp, the signal output from the piezoelectric pickup is effectively useless and the acoustic guitar will not be electrically amplified. During a performance, for example, it will become necessary for the performer to stop playing and change the battery. In many preamp systems, this requires the time consuming loosening or removing of some or all of the strings, in order to reach and replace the battery located within the acoustic guitar.

In preparation of a performance, the guitarist may setup the guitar, preamp and amplifier for the purpose of a sound check or the like. Once ready, the scheduled performance may not begin immediately or the player may take a break between songs. To conserve the battery of the preamp, or for some other reason, the performer or assistant may unplug the guitar cable from the acoustic guitar preamp in order to disconnect the battery from the circuit. However, if the volume at the amplifier or soundboard is not turned down first, unplugging the guitar cable is often met with a short but very load sound which may damage speakers and irritate the audience and others. Often, the amplifier may not be close to the player or under the player's control, contributing to the occasion of unplugging the cable without reducing the volume.

There is a need to improve the battery life of acoustic guitar preamps. In addition, there is a desire to minimize or avoid creating a loud sound when unplugging the guitar cable.

SUMMARY OF THE INVENTION

The present invention provides a power control and indicator device for coupling to an acoustic string instrument preamp.

DETAILED DESCRIPTION OF THE INVENTION

Figure 1:
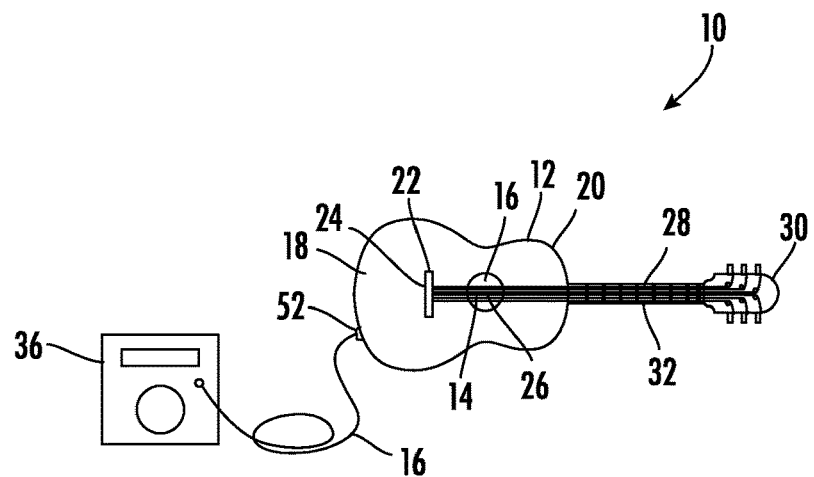
FIG. 1 is a perspective view of a prior art acoustic guitar with a preamp, plugged into an amplifier.

FIG. 1 is a perspective view of an acoustic guitar 10. The guitar 10 includes a body 12 which defines a cavity 14. The body 12 includes a backboard 16, soundboard 18, and ring 20. The soundboard includes a bridge 22, saddle 24 and a sound hole 26. A neck 28 extends from the body 12 and terminates at a headstock 30. Guitar strings 32 extend between the bridge 22 and the headstock 30.

Figure 2:
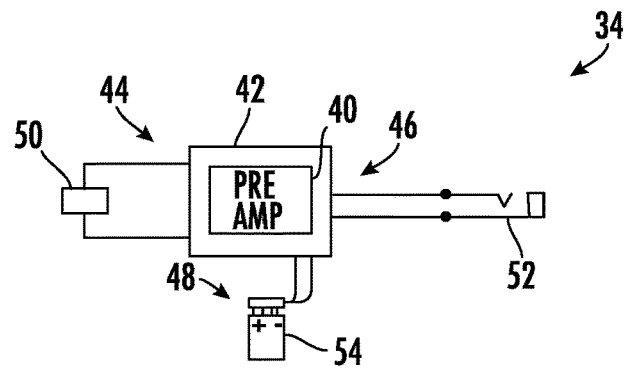
FIG. 2 is a schematic diagram of the prior art preamp shown in FIG. 1.

The acoustic guitar 10 includes a prior art preamp 34. The preamp 34 is generally located within the cavity 14 of the guitar 10. The preamp 34 is seen in FIG. 2. The preamp 34 is shown plugged into an amplifier 36 via a guitar cable 16.

FIG. 2 is a schematic diagram of the prior art preamp 34. The preamp 34 includes an amplifier circuit 40 within a housing 42 and including an input 44, an output 46 and a power connector 48. A piezoelectric pickup 50 is coupled to the input 44. While a piezoelectric pickup 50 is shown, other types of pickups may be used. A guitar output connector 52 is coupled to the output 46. A 9 volt battery 54 is connected to the power connector 48. FIG. 1 shows the guitar output connector 52. The piezoelectric pickup 50 in the embodiment of FIG. 1 is located under the saddle 24. The amplifier circuit housing 42 and battery 54 are located within the cavity 14 of the guitar 10.

Figure 3:
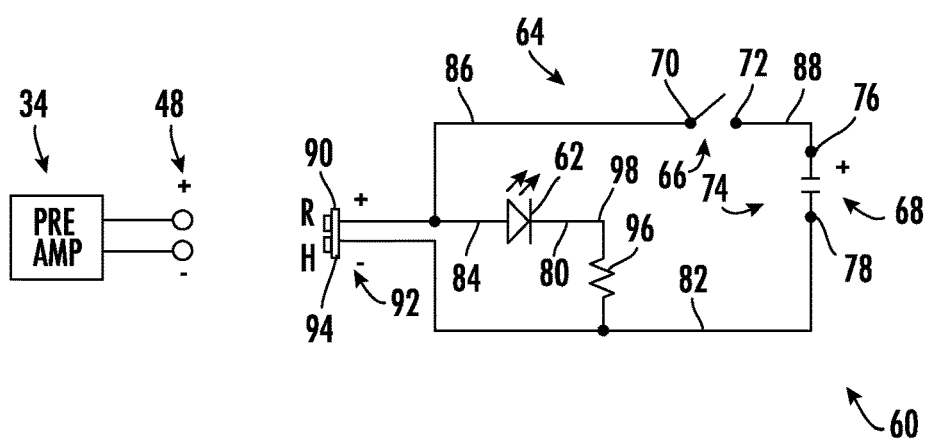
FIG. 3 is a schematic diagram of a power control and indicator circuit in accordance with one embodiment of the present invention.

One embodiment of the power control and indicator circuit 60 of the present invention is shown in FIG. 3. The circuit 60 includes a light emitting diode (LED) 62 coupled in parallel to a circuit 64 comprising a switch 66 and a 9 volt battery 68. The switch 66 is a low voltage push button single pole single throw switch and includes a first terminal 70 and second terminal 72. The 9 volt battery 68 is connected to the parallel circuit by means of a first 9 volt battery connector 74 (See FIG. 4). The first 9 volt battery connector 74 has a typical hexagon shaped positive terminal 76 and a round negative terminal 78. As can be seen, the cathode 80 of the LED 62 is connected to a resistor 96 via circuit 98. The resistor 96 functions as a current limiting resistor. The current limiting resistor 96 may or may not be required as one skilled in the art will understand. The resistor 96 is connected to the negative terminal 78 via a negative circuit 82. The anode 84 of the LED 62 is connected to the first terminal 70 of the switch 66 via a positive circuit 86. The second terminal 72 of the switch 66 is connected to the positive terminal 76 via a circuit 88.

The anode 84 of the LED 62 is connected to round terminal 90 of a second 9 volt battery connector 92 or preamp connector 92 via the positive circuit 86. The resistor 96 is connected to the hexagon terminal 94 of the second 9 volt battery connector 92 via the negative circuit 82.

It will be appreciated that the position of the switch 66 and first battery connector 74 within circuit 64 may be swapped without departing from the spirit of the invention. Further, the position of the light emitting diode 62 and resistor 96 may be swapped without departing from the spirit of the invention. Other variations of the circuit 60 will also be understood to be within the scope of the invention to one skilled in the art.

Figure 4:
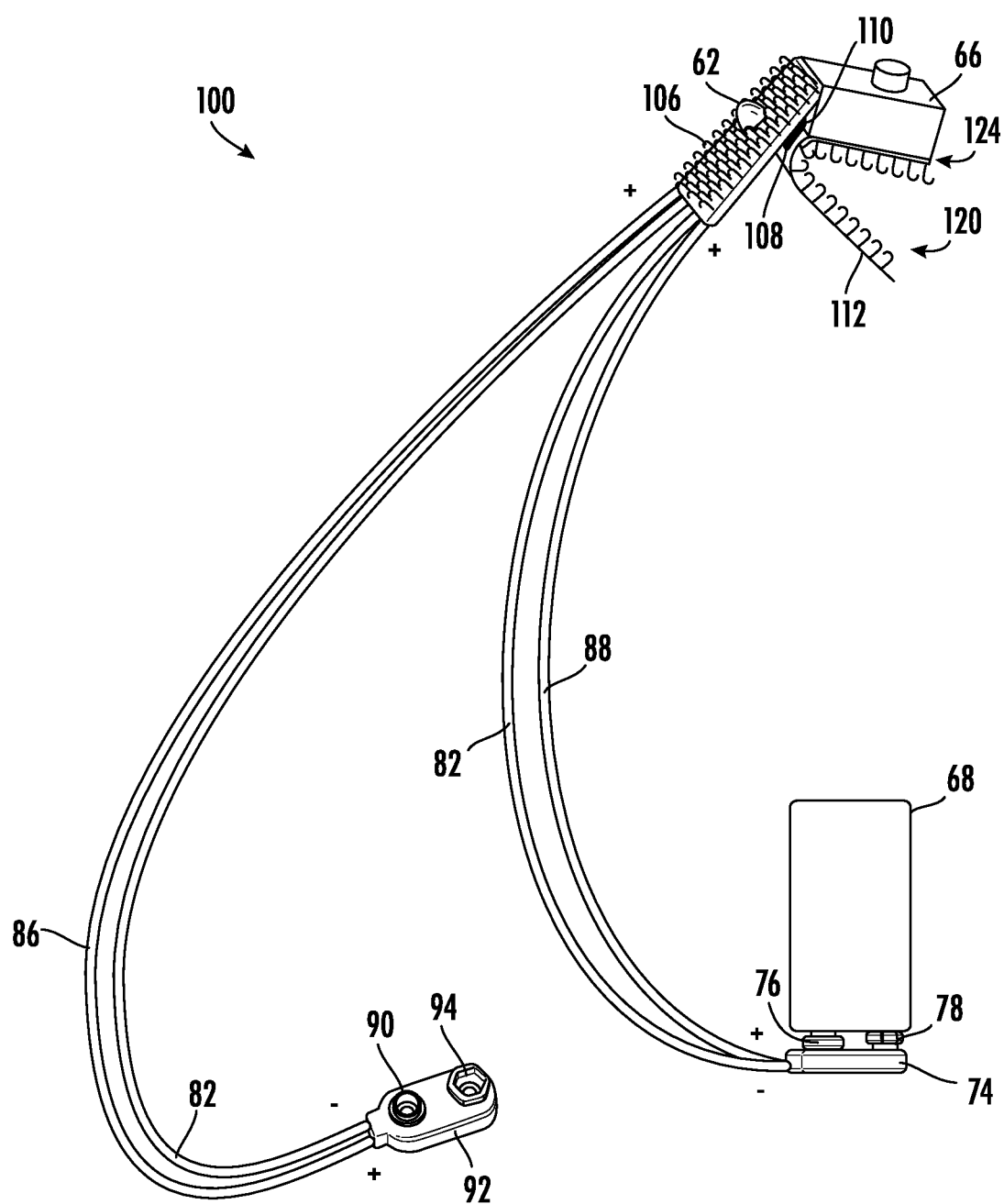
FIG. 4 is a perspective view of a power control and indicator device incorporating the power control and indicator circuit of FIG. 3.

FIG. 4 is a perspective view of the power control and indicator device 100 incorporating the circuit 60 of FIG. 3.

Figure 5:
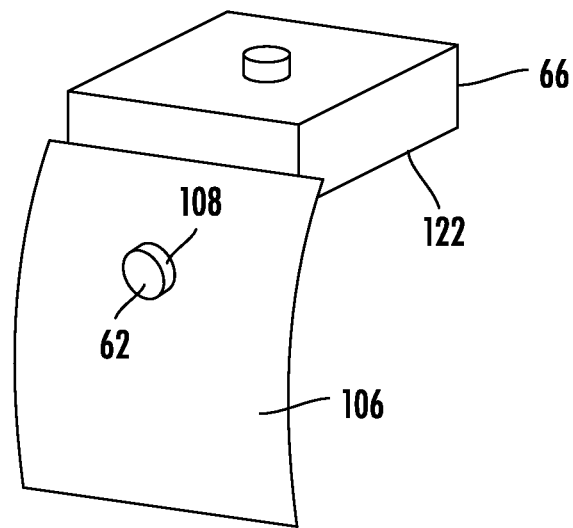
FIG. 5 is a perspective view of the switch and associated components of the device of FIG. 4 in an intermediary stage of manufacturing.

FIG. 5 is a partial perspective view of the power control and indicator device 100 of FIG. 4 in an intermediary stage of manufacturing. A section of self-engaging fastener 106 is shown adjacent the switch 66. The self-engaging fastener 106 includes a hole or opening 108 extending through the fabric of the fastener. The light-emitting diode 62 is shown protruding through the opening 108. Behind the self-engaging fastener 106 is the terminals 70, 72 of the switch 66 and the light-emitting diode 62 and resistor 96. With the self-engaging fastener 106 positioned over the LED 62, the self-engaging fastener 106 is folded around the light-emitting diode 62, resistor 96 and associated circuit in a self-overlapping arrangement so as to be self-engaging.

This arrangement may leave an open area 108 (FIG. 4) where the switch 66 and self-engaging fastener 106 meet. The circuit extending between the self-engaging fastener 106 and switch 66 are exposed and visible. The open area 108 is filled in with hot glue 110 (FIG. 4) to seal and protect the exposed circuit.

Figure 6:
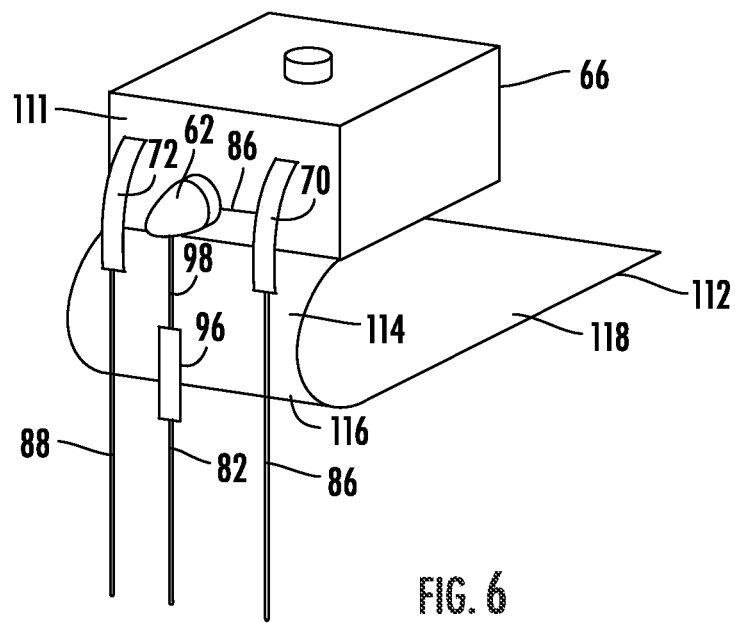
FIG. 6 is a perspective view of the switch and associated components of the device of FIG. 4 in another intermediate stage of manufacturing, including a copper strip shown as an illustration.

FIG. 6 is a perspective view of the switch 66 before the self-engaging fastener 106 is secured to the circuit. The light-emitting diode 62 is positioned adjacent a side 111 of the switch 66 to extend away from the switch 66 in anticipation of positioning the light-emitting diode 62 to protrude from the opening 108 of the self-engaging fastener 106. For the sake of illustration, a copper strip 112 is shown positioned below the switch 66. The copper strip 112 is shown bent or folded over in a U-shaped fashion forming a top outside surface 114, bottom outside surface 116 and an inside surface 118. A hook and loop fastener 120, 126, 128 may be used to secure the device 100 to a guitar 10. The soft or loop portion 120 of the fastener may be secured to the inside surface 118 of the copper strip 112 as shown in FIG. 4. The arrangement of the corresponding hook portion 126, 128 will be described later.

The top outside surface 114 of the strip 112 of copper is secured to the bottom side 122 of the switch 66 using an epoxy 124 or similar means of attaching, as shown in FIG. 4.

Figure 7:
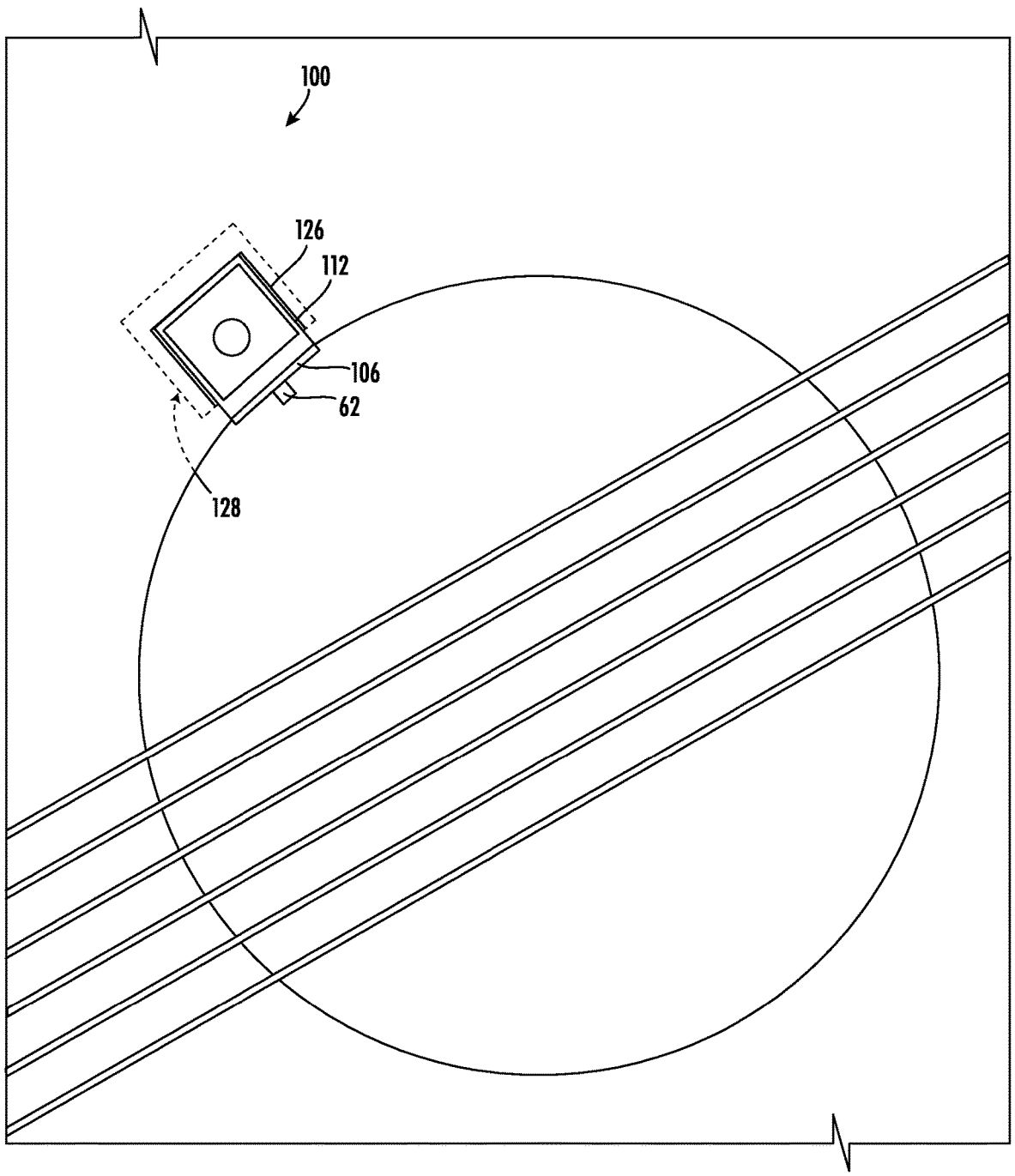
FIG. 7 is a partial perspective view of an acoustic guitar with the power control and indicator device of FIG. 4 installed in the acoustic guitar.

FIG. 7 shows device 100 secured to the guitar 10. As can be seen, a first small square section 126 of coarse or hook portion of the fastener may be secured to the outside of the soundboard 18 of the guitar 10, and a second small square section 128 of coarse or hook portion of the fastener may be secured to the inside of the soundboard 18. The first and second sections 126, 128 are positioned at the edge of the sound hole 26 and aligned in essentially an overlapping arrangement. The device 100 is secured to the guitar 10 by means sliding the U-shaped strip 112 of copper over the edge of the sound hole 26 and aligned with the first and second sections 126, 128 of the soft or loop portion 120 of the fastener. The copper strip 112 is squeezed or pressed into position with portions of the soft or loop portion 120 of the fastener engaging the first and second sections 126, 128 of the course or hook portion of the fastener. The clamping force of the strip 112 of copper contributes to securing the device 100 to the guitar 10 in addition to the hook and loop fastener 120, 126, 128.

Alternatively, the first and second sections 126, 128 may consist of a single section folded over the edge of the sound hole 26 and secured to the outside and inside of the soundboard 18.

The preamp connector 92 is coupled to the preamp 34 located within the guitar 10. The battery connector 74 is coupled to a battery and also positioned within the guitar 10. Various fasteners or clips (not shown) may be used to position the wires and connectors so as not to be seen by the audience during a performance.

The invention claimed is:

1. A power control and indicator device for coupling to an acoustic string instrument preamp, comprising:

a light emitting diode having an anode terminal and a cathode terminal;

a switch having a first terminal and a second terminal, the switch having a closed position that closes a circuit between the first and second terminal and an open position that opens the circuit between the first and second terminal;

a battery connector having a positive terminal and a negative terminal, the battery connector adapted to couple to a battery;

a preamp connector having a positive terminal and a negative terminal;

wherein the battery connector and the switch are coupled in series via a series circuit, the light emitting diode is coupled in parallel with the series connected switch and battery connector via a positive circuit and a negative circuit, and the positive circuit is coupled to the positive terminal of the preamp connector and the negative circuit is coupled to the negative terminal of the preamp connector, wherein the preamp connector is a 9 volt battery connector having a round terminal and a hexagon terminal, the round terminal is connected to the positive circuit and the hexagon terminal is coupled to the negative circuit, and the preamp connector is adapted to be coupled to the 9 volt battery connector of an existing acoustic string instrument preamp, whereby with a battery connected to the battery connector, wherein with the switch in the closed position, the light emitting diode is powered and illuminates and the battery connector is coupled to the preamp connector, the battery provides power to the preamp connector, and wherein with the switch in the open position, the light emitting diode is not powered and does not illuminate and the battery connector is not coupled to the preamp connector and the battery does not provide power to the preamp connector.

2. The power control and indicator device of claim 1, further comprising a current limiting resistor connected in series with the light-emitting diode.

3. The power control and indicator device of claim 2, further comprising the switch includes a side surface and a bottom surface, the first terminal and the second terminal extend outwardly from the side surface of the switch, the light-emitting diode, current limiting resistor, and associated circuits are coupled to the first and second terminals adjacent to the side surface of the switch, a section of self-engaging fastener includes an opening to receive the light-emitting diode, the section is folded over the light-emitting diode, resistor and associated circuit in an overlapping and self-engaging and secure manner, a strip of copper is formed in a U-shaped manner, forming a top surface, bottom outside surface, and an inner surface, and further comprising a two part self-adhesive backed hook and loop fastener, with one part secured to the inner surface and the other part secured to the acoustic string instrument so that the device is secured to the acoustic string instrument, the other part of the two part self-adhesive backed hook and loop fastener may be secured to the front and back side of the sound board, and the preamp connector is adapted to couple with the preamp located in the acoustic string instrument and the battery connector is adapted to be coupled to a battery and located in the acoustic string instrument.

4. The power control and indicator device according to claim 3, wherein the secured self-engaging fastener and switch may form an open area there between, exposing portions of the circuit, the open area is sealed with hot glue.

5. The power control and indicator device of claim 1, wherein the switch is a single-pole, single-throw, low voltage, push-button switch.

6. The power control and indicator device of claim 1, wherein the battery connector is a 9 volt battery connector.

7. The power control and indicator device of claim 1, wherein the battery connector includes a hexagon terminal coupled to the anode side of the series circuit and a round terminal coupled to the cathode side of the series circuit.

8. The power control and indicator device of claim 1, wherein the terminals of the switch are secured to respective wires via solder, and clips are used to secure sections of the wire to ribbing located within the guitar.

9. A combination acoustic string instrument preamp and a power control and indicator device, the combination comprising:
 a preamplifier having a signal input, signal output, and a power input;
 a pickup having an output coupled to the signal input of the preamplifier;
 an output connector adapted to couple to an amplifier cable, the output connector coupled to the signal output of the preamplifier;
 a light emitting diode having an anode terminal and a cathode terminal;
 a switch having a first terminal and a second terminal, the switch having a closed position that closes a circuit between the first and second terminal and an open position that opens the circuit between the first and second terminal;
 a battery connector having a positive terminal and a negative terminal, the battery connector adapted to couple to a battery;
 a preamp connector having a positive terminal and a negative terminal, the preamp connector adapted to couple to the power input of the preamplifier;
 wherein the battery connector and the switch are coupled in series via a series circuit, the light emitting diode is coupled in parallel with the series connected switch and battery connector via a positive circuit and a negative circuit, and the positive circuit is coupled to the positive terminal of the preamp connector and the negative circuit is coupled to the negative terminal of the preamp connector, wherein the preamp connector is a 9 volt battery connector having a round terminal and a hexagon terminal, the round terminal is connected to the positive circuit and the hexagon terminal is coupled to the negative circuit, and the preamp connector is adapted to be coupled to the 9 volt battery connector of an existing acoustic string instrument preamp,
 whereby with a battery connected to the battery connector, wherein with the switch in the closed position, the light emitting diode is powered and illuminates and the battery connector is coupled to the preamp connector, the battery provides power to the preamplifier, and wherein with the switch in the open position, the light emitting diode is not powered and does not illuminate and the battery connector is not coupled to the preamp connector, the battery does not provide power to the preamplifier.

10. A power control and indicator device for coupling to an acoustic string instrument preamp, comprising: a light emitting diode having an anode terminal and a cathode terminal; a switch having a first terminal and a second terminal, the switch having a closed position that closes a circuit between the first and second terminal and an open position that opens the circuit between the first and second terminal; a battery connector having a positive terminal and a negative terminal, the battery connector adapted to couple to a battery; a preamp connector having a positive terminal and a negative terminal; a current limiting resistor connected in series with the light-emitting diode; wherein the switch includes a side surface and a bottom surface, the first terminal and the second terminal extend outwardly from the side surface of the switch, the light-emitting diode, current limiting resistor, and associated circuits are coupled to the first and second terminals adjacent to the side surface of the switch, a section of self-engaging fastener includes an opening to receive the light-emitting diode, the section is folded over the light-emitting diode, resistor and associated circuit in an overlapping and self-engaging and secure manner, a strip of copper is formed in a U-shaped manner, forming a top surface, bottom outside surface, and an inner surface, and further comprising a two part self-adhesive backed hook and loop fastener, with one part secured to the inner surface and the other part secured to the acoustic string instrument so that the device is secured to the acoustic string instrument, the other part of the two part self-adhesive backed hook and loop fastener may be secured to the front and back side of the sound board, and the preamp connector is adapted to couple with the existing preamp located in the acoustic string instrument and the battery connector is adapted to be coupled to a battery and located in the acoustic string instrument, whereby with a battery connected to the battery connector, wherein with the switch in the closed position, the light emitting diode is powered and illuminates and the battery connector is coupled to the preamp connector, the battery provides power to the preamp connector, and wherein with the switch in the open position, the light emitting diode is not powered and does not illuminate and the battery connector is not coupled to the preamp connector and the battery does not provide power to the preamp connector.

11. The power control and indicator device according to claim 10, wherein the secured self-engaging fastener and switch may form an open area there between, exposing portions of the circuit, the open area is sealed with hot glue.

\* \* \* \* \*